(12) United States Patent
Kohsiek

(10) Patent No.: US 9,178,492 B2
(45) Date of Patent: Nov. 3, 2015

(54) ADJUSTABLE MOS RESISTOR

(75) Inventor: Cord-Heinrich Kohsiek, Ellerau (DE)

(73) Assignee: NXP B.V., Eindhoven (NL)

( * ) Notice: Subject to any disclaimer, the term of this patent is extended or adjusted under 35 U.S.C. 154(b) by 526 days.

(21) Appl. No.: 14/119,834

(22) PCT Filed: Dec. 28, 2009

(86) PCT No.: PCT/IB2009/055956
§ 371 (c)(1),
(2), (4) Date: Jul. 10, 2014

(87) PCT Pub. No.: WO2011/080536
PCT Pub. Date: Jul. 7, 2011

(65) Prior Publication Data
US 2014/0320204 A1  Oct. 30, 2014

(51) Int. Cl.
*H03H 11/24* (2006.01)
(52) U.S. Cl.
CPC .................................. *H03H 11/245* (2013.01)
(58) Field of Classification Search
CPC .................................................. H03H 11/245
See application file for complete search history.

(56) References Cited

U.S. PATENT DOCUMENTS

| | | | |
|---|---|---|---|
| 3,213,299 A | 10/1965 | Rogers | |
| 3,943,286 A * | 3/1976 | Tsurushima | 330/277 |
| 5,006,733 A * | 4/1991 | Brown | 327/553 |
| 5,216,354 A * | 6/1993 | DeGuelle | 323/312 |
| 5,345,118 A | 9/1994 | White et al. | |
| 6,154,085 A * | 11/2000 | Ramakrishnan | 327/404 |
| 6,297,664 B1 * | 10/2001 | Galli | 326/30 |
| 6,404,269 B1 * | 6/2002 | Voldman | 327/534 |
| 6,492,866 B1 | 12/2002 | Berg et al. | |
| 6,552,879 B2 * | 4/2003 | Voldman | 360/323 |
| 6,628,159 B2 * | 9/2003 | Voldman | 327/534 |
| 7,027,568 B1 * | 4/2006 | Simpson et al. | 379/88.16 |
| 7,750,738 B2 * | 7/2010 | Bach | 330/278 |
| 8,004,340 B2 * | 8/2011 | Guo et al. | 327/333 |
| 8,723,600 B1 * | 5/2014 | Cagdaser et al. | 330/259 |
| 2002/0186066 A1 | 12/2002 | Soda | |
| 2007/0052792 A1 * | 3/2007 | Mulligan et al. | 348/14.1 |
| 2015/0008871 A1 * | 1/2015 | Petenyi | 320/107 |
| 2015/0024693 A1 * | 1/2015 | Cook et al. | 455/67.14 |

FOREIGN PATENT DOCUMENTS

| | | |
|---|---|---|
| DE | 41 29 334 A1 | 3/1992 |
| JP | 7 079132 A | 3/1995 |

OTHER PUBLICATIONS

Wang, Z.; "Current-Controlled Linear MOS Earthed and Floating Resistors and their Application"; IEEE Proceedings Circuits, Devices and Systems, vol. 137, No. 6; pp. 479-481 (Dec. 1990).

(Continued)

*Primary Examiner* — Thomas J Hiltunen

(57) ABSTRACT

A variety of circuits, methods and devices are implemented for providing an adjustable resistance. According to one such implementation an adjustable resistive device includes a metal-oxide semiconductor (MOS) transistor having a gate, a drain, a source, and a body. First circuitry controls a resistance from drain to source by applying a gate voltage that is a function of a variable control input. Second circuitry adjusts a voltage at the body according to a drain voltage and a source voltage, whereby the resistance from drain to source is substantially linear for a given value of the variable control input and over a voltage range.

17 Claims, 7 Drawing Sheets

(56) References Cited

OTHER PUBLICATIONS

Yasunari, J., et al.; "A CMOS Continuous-time FPAA Analog Core Using Automatically-tuned MOS Resistors"; MWSCAS 2004, vol. 1; pp. 153-156; (2004).

Ozalevli, E., et al.; "Programmable Floating-gate CMOS Resistors"; IEEE Intl. Symp. on Circuits and Systems, vol. 3; pp. 2168-2171 (May 2005).

Ozalevli, E., et al.; "Design of a CMOS Floating-gate Resistor for Highly Linear Amplifier and Multiplier Applications"; Proc. Of IEEE 2005 Custom Integrated Circuits Conference; pp. 735-738 (Sep. 2005).

Lopez-Martin, A. J., et al.; "Rail-to-Rail Tunable CMOS V-I Converter"; 2006 IEEE Intl. Symp. on Circuits and Systems; 4 pages (May 2006).

Worapishet, A., et al.; "Sub-threshold R-Mosfet Tunable Resistor Technique"; Electronics Letters, vol. 43, Issue 7; pp. 390-392; (Mar. 29, 2007).

Huang, H-W., et al.; "Programmable Voltage-to-Current Converter with Linear Voltage Control Resistor"; IEEE Intl. Symposium on Circuits and Systems; p. 2310-2313 (May 2008).

Ozalevli, E., et al.; "Tunable Highly Linear Floating-Gate CMOS Resistor Using Common-Mode Linearization Technique"; IEEE Trans. On Circuits & Systems, vol. 55, No. 4; pp. 999-1010 (May 2008).

Dogan, H., et al.; "Analysis and Design of RF CMOS Attenuators"; Solid State Circuits, vol. 43, No. 10 (Oct. 2008).

International Search Report for application PCT/IB2009/055956 (Nov. 5, 2010).

\* cited by examiner

US 9,178,492 B2

ADJUSTABLE MOS RESISTOR

FIELD OF THE INVENTION

The present invention relates generally to adjustable resistors, and more specifically, to MOS-based resistors having a linear response.

BACKGROUND

Resistive elements are used in a wide range of applications. One such application relates to signal-conditioning and/or filtering. Signal-conditioning and filtering applications often use resistive elements as part of a signal-conditioning circuit. The responses of the signal-conditioning circuits depend upon the resistive values of the resistive elements. Thus, the signal-conditioning circuits are designed with resistive elements having values that are tailored towards the specific applications.

The true resistive value for resistive elements varies according to specific manufacturing parameters, which can lead to resistive mismatches for a signal-conditioning circuit with tight design parameters. The resistive value can also vary according to temperature, which can adversely affect the signaling-conditioning circuit. Moreover, devices are continuing to be used in applications that require tighter constraints on the signal-conditioning circuits. Further complicating the issue, some devices use a variety of different signals, which can each require a different set of signal-conditioning parameters. Coupled with increasing demand for smaller, faster, cheaper, and less power-hungry devices, a standard/static resistive element is often inadequate.

Accordingly, various circuits use resistors with adjustable resistances. The use of adjustable resistors allows for both wider ranges of applications, for fine tuning of the actual resistive value and for feedback circuits that control the resistive value.

A particular type of an adjustable resistor is implemented using CMOS transistors as the resistive element. Important aspects of such adjustable resistor can include the linearity of the resistance and range of adjustable resistive values.

SUMMARY

The present invention is exemplified in a number of implementations and applications, some of which are summarized below.

Consistent with an example embodiment of the present invention, an adjustable resistive device includes a metal-oxide semiconductor (field-effect) transistor (MOSFET or MOS transistor) having a gate, a drain, a source, and a body. First circuitry controls a resistance from drain to source by applying a gate voltage that is a function of a variable control input. Second circuitry adjusts a voltage at the body according to a voltage at the drain and a voltage at the source, whereby the resistance from drain to source is substantially linear for a given value of the variable control input and over a voltage range.

According to another embodiment of the present invention, an adjustable resistive device includes a variable control input and a plurality of MOS transistors connected in parallel across drain and source of each transistor. Each MOS transistor of the plurality has a gate, a drain, a source, a channel between the source and the drain, and a body. The MOS transistor provides a relatively linear resistance from drain to source over a voltage range applied thereto. For each MOS transistor of the plurality of MOS transistors, first circuitry adjusts a voltage at the gate as a function of the variable control input and second circuitry adjusts a voltage at the body according to a voltage at the drain and a voltage at the source. Each MOS transistor of the plurality of MOS transistors provides the relatively linear resistance from drain to source for a different range of values for the variable control input.

Consistent with an embodiment of the present invention, an adjustable resistive device includes a MOS transistor having a gate, a drain, a source and a first body and providing resistive output from drain to source. A first resistor is connected between the source and the body. A second resistor is connected between the drain and the body. A third resistor is connected between the gate and the body. A current mirror circuit generates a current through the third resistor that mirrors a controllable current source.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
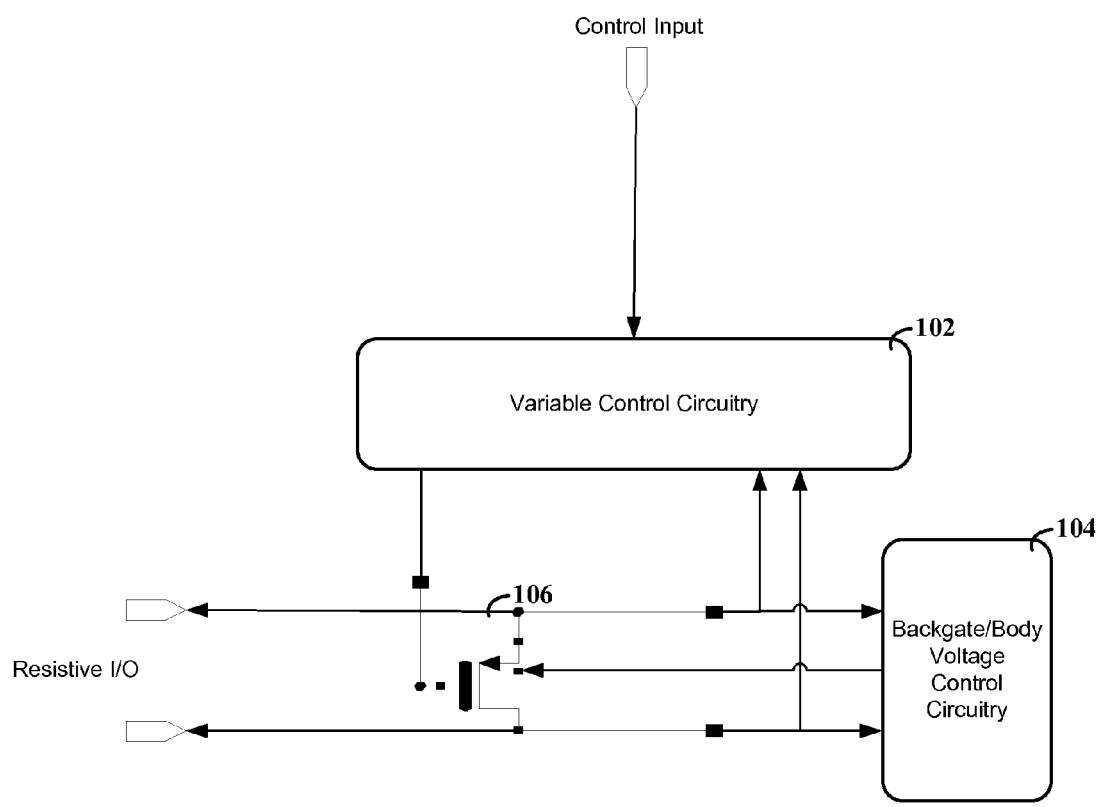
FIG. 1 depicts an adjustable resistive circuit, consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

DETAILED DESCRIPTION

The present invention is believed to be applicable to a variety of different types of processes, devices and arrangements for use with adjustable resistor elements. While the present invention is not necessarily so limited, various aspects of the invention may be appreciated through a discussion of examples using this context.

Aspects of the present invention recognize the need for a resistive element that provides, for a particular resistive setting, a linear resistance over a wide operating range for an input signal. Aspects of the present invention also relate to providing a wide adjustment range for the resistive values provided by the resistive element. Related aspects are directed towards providing a step wise increasing resistor value with constant steps between resistor values (constant resistor value step or constant resistor value ratio relative to a variable control input).

As used herein, a linear resistance/response is represented by a resistive output that provides a substantially linear V-I response (e.g., V=IR, where R is substantially constant). In a particular implementation, the output differential (dV/dI) resistive values are relatively constant for a given control input setting for the adjustable resistive element. Nonlinear resistors include resistors that, for a given control input setting, do not provide a substantially linear V-I response.

Embodiments of the present invention relate to an adjustable resistive device that is implemented using a metal-oxide semiconductor (MOS) transistor. As used herein, and unless otherwise stated, MOS can refer to either NMOS or PMOS technology. This extends to the figures, which may show a particular implementation of NMOS or PMOS but are not necessarily limited thereto. The resistive device allows for the resistive value to be adjusted in response to a control input. The resistive value is maintained relatively constant over an operating voltage range by controlling the voltage of the body of the transistor as a function of the signal voltage at an input of the resistive device.

Consistent with an embodiment of the present invention, an adjustable resistive device is implemented. The device includes a metal-oxide semiconductor (MOS) transistor. The MOS transistor has a gate, a drain, a source, and a body. First circuitry controls a resistance from drain to source by applying a gate voltage that is a function of a drain to source voltage and a variable control input. Second circuitry adjusts a voltage at the body according to a voltage at the drain and a voltage at the source. This combination is set such that the resistance from drain to source is substantially constant for a given value of the variable control input and over a voltage range. For instance, the voltage at the body can be set between the voltage at the drain and the voltage at the source (e.g., halfway between).

According to another embodiment of the present invention, an adjustable resistive device includes a plurality of metal-oxide semiconductor (MOS) transistors connected in parallel across drain and source of each transistor and each having a gate, a drain, a source, a channel between the source and the drain, and a body. Each MOS transistor provides, for a given control input, a relatively constant resistance from drain to source over a range of voltages applied thereto. For each MOS transistor of the plurality of MOS transistors, there is circuitry to adjust a voltage at the gate as a function of a voltage applied at the drain, a voltage applied at the source and a variable control input, and also circuitry to adjust a voltage at the body according to a voltage applied at the drain and a voltage applied at the source. Each MOS transistor of the plurality of MOS transistors provides, for a given control input, the relatively constant resistance from drain to source for a different range of values for the range of voltages applied thereto.

Consistent with a particular implementation, an adjustable resistive device is provided that includes a MOS transistor having a gate, a drain, a source and a first body and providing resistive output from drain to source. A first resistor electrically connects the source to the body. A second resistor electrically connects the drain to the body. A third resistor electrically connects the gate to the body. A controllable current source is connected to a current mirror circuit that generates a current through the third resistor that mirrors a current through the controllable current source.

Aspects of the present invention are particularly well-suited for integrated circuits constructed as part of a CMOS process as adjustable resistive elements can be generated using CMOS transistors. One such application relates to analog gain control (AGC) for a radio-frequency (RF) tuner that is designed using a CMOS process. Implementations of an AGC on chip are often frustrated by a lack of sufficient linearity in the resistive elements. Accordingly, some implementations use PiN (P-intrinsic-N) diodes; however, PiN diodes often add to the cost of the device. While an arguably cheaper on-chip AGC can be realized using a stepwise-switched AGC, this can cause the noise to increase and decrease in steps. Accordingly, aspects of the present invention relate to resistive elements provided using MOS transistors and can be particularly useful for providing a linear/consistent response without noise steps of a stepwise-switched AGC or the extra cost associated with PiN diodes.

Consistent with an embodiment of the present invention, a circuit is implemented to provide an adjustable resistance. The circuit is based upon a MOS transistor. The circuit controls voltages across both the gate and the body/backgate of the MOS transistor. The circuit includes an input port connected across the drain and source of the transistor. When used in-circuit, this input port provides the resistive value set by the transistor. The circuit sets the gate voltage of the MOS transistor as a function of a control input. The control input provides a mechanism for adjusting the resistive value. The circuit also adjusts the gate voltage as a function of the voltage seen on the input port. The circuit controls the voltage of the body as a function of the voltage seen on the input port.

In particular implementations, the circuit can be designed for a symmetric input voltage, in that the input voltage is applied from drain to source to be centered about a relatively constant voltage. Thus, the $V_{ds}$ (voltage from drain to source) is centered around a relatively constant reference point. Aspects of the present invention recognize that given a symmetrically applied input voltage, the body voltage can be set accordingly. For instance, the body voltage can be set to a voltage that differs from the drain and source voltage, and more particularly, to a voltage that is proportional to the voltage at the drain and the voltage at the source (e.g., halfway between the voltages at the drain and source).

In certain embodiments, the circuit can be designed to adjust operational voltages for what is an otherwise unsymmetrical input voltage. For instance, the circuit can adjust the body voltage relative to the input voltage. This allows the operation of the circuit to be similar to a symmetrically applied input voltage as the body voltage dynamically adjusts for DC shifts in the value of the input voltage.

Still other embodiments of the present invention relate to resistive elements formed from a plurality of MOS transistors. Each of the MOS transistors is designed with different saturation characteristics. This can be particularly useful for providing an extended range of operation for the entire circuit. For instance, wide-channel MOS transistors can provide relatively low resistive values; however, they can also exhibit distortion at high-resistive values. This distortion can result in nonlinearities in the resistance. MOS transistors with smaller-channels offer better response at high-resistive values. Accordingly, an implementation involves placing MOS transistors in parallel. The MOS transistors are designed with increasing channel widths. The circuit is designed such that the smaller-channel MOS transistors dominate for the high-resistive values, whereas the large-channel MOS transistors dominate for the low-resistive values.

Turning now to the figures, FIG. 1 depicts an adjustable resistive circuit, consistent with an embodiment of the present invention. MOS transistor 106 provides the resistive value for the resistive input/out (I/O) port in the form of a current from drain to source. The amount of current is proportional to the input voltage and can be set such that the resistive value (V/I) is relatively constant over the operating voltage range.

Variable control circuitry 102 sets resistive value in response to a control input. In particular, variable control circuitry 102 sets the voltage on the gate of the MOS transistor thereby controlling the current from drain to source. Variable control circuitry 102 determines the appropriate voltage as a function of the voltage at the drain, the voltage at the source and the control input.

Backgate/body voltage control circuitry 104 sets the voltage of the body of the MOS transistor. In particular, body voltage control circuitry 104 sets the body voltage as a function of the voltage at the drain and the voltage at the source. In one implementation, the voltage applied to the resistive I/O is symmetric about a relatively constant voltage. For such an implementation, the body voltage can be set to an associated constant voltage. For instance, the input voltage may be symmetric about ground (GND) and the body voltage can also be set to ground. Consistent with another implementation, the body voltage can be dynamically adjusted as a function of an unsymmetrical resistive I/O voltage, such as where the midpoint of the $V_{ds}$ applied voltage changes over time. The voltage control circuitry 104 responds to this change by adjusting the body voltage according. For example, the input voltage may start at 1V at source and 0V at drain and then change to 0.5V at source and 0V at drain. Thus, the midpoint of the first voltage is 0.5V, whereas the midpoint of the second voltage is 0.25V. The voltage control circuitry 104 adjusts the body voltage accordingly.

Figure 2:
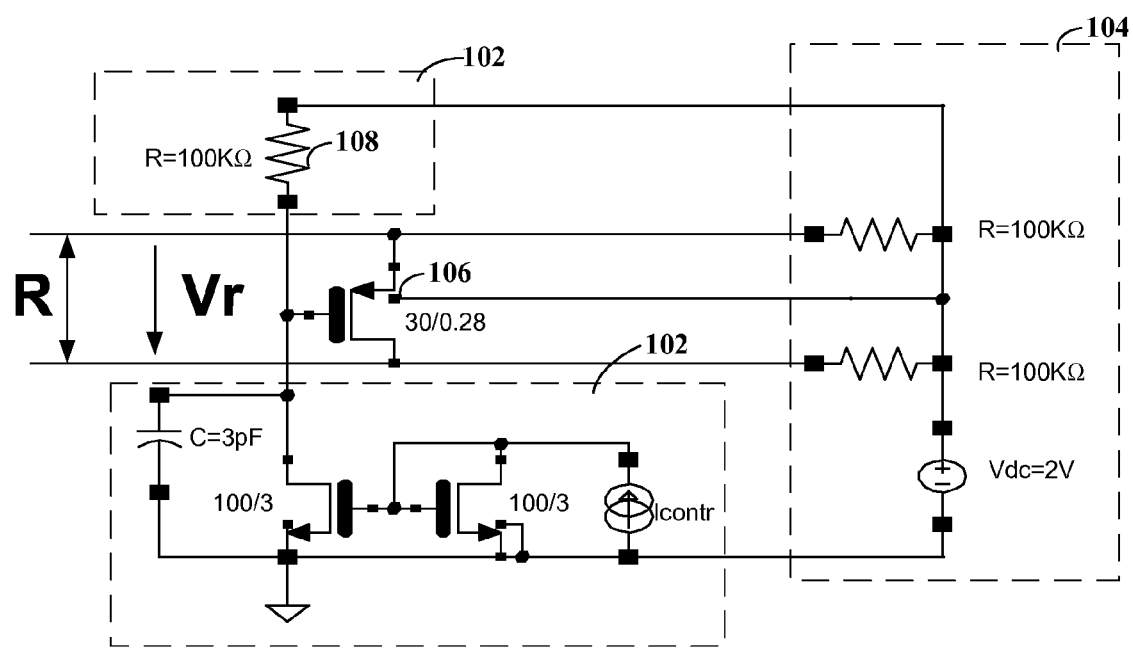
FIG. 2 depicts an adjustable resistive circuit designed for symmetrical input operation, consistent with an embodiment of the present invention.

FIG. 2 depicts an adjustable resistive circuit designed for symmetrical input operation, consistent with an embodiment of the present invention. The adjustable resistive circuit includes a MOS transistor 106 that provides resistance R for an applied voltage $V_r$. Circuitry 102 controls the resistive value of the circuit. In the particular example shown in FIG. 2, circuitry 102 is responsive to an input $I_{contr}$. Circuitry 102 includes a current mirror that follows the input $I_{contr}$ and thereby generates a current across a resistor 108. In this manner, changes to $I_{contr}$ result in an adjustment of the gate voltage, thereby adjusting the resistance of the circuit. In certain implementations, the gate voltage is determined relative to the body voltage. Optionally, a filter circuit (e.g., a capacitor) can be used to reduce noise, such as ripple, at the gate.

Circuitry 104 results in the body voltage of MOS transistor 106 having a value that is relative to the input voltage $V_r$. For instance, the particular resistive values (100KΩ each) of FIG. 2 result in a body voltage that is half of $V_r$. In certain applications, the input voltage is effectively level-shifted so that the voltages at the drain and the source of the MOS transistor 106 are symmetric about the voltage applied to the body of the MOS transistor 106. This results in the body to drain voltage having the same magnitude as the body to source voltage. This is particularly useful for limiting the peak of either voltage by equal distribution thereof and thereby reducing $2^{nd}$ order distortion.

In certain implementations, a direct current (DC) offset, relative to ground, can be introduced to the voltage applied to the transistor body. This can be particularly useful where the peak voltage of the resistor is otherwise limited by a forward current of the diode formed from the body to the drain or the source. In the specific implementation depicted, the DC offset has a value of about 2 volts, although other values are possible.

FIG. 2 also depicts the length/width parameters of the MOS transistors in micrometers. These values are but a few examples and not necessarily limiting.

Figure 3:
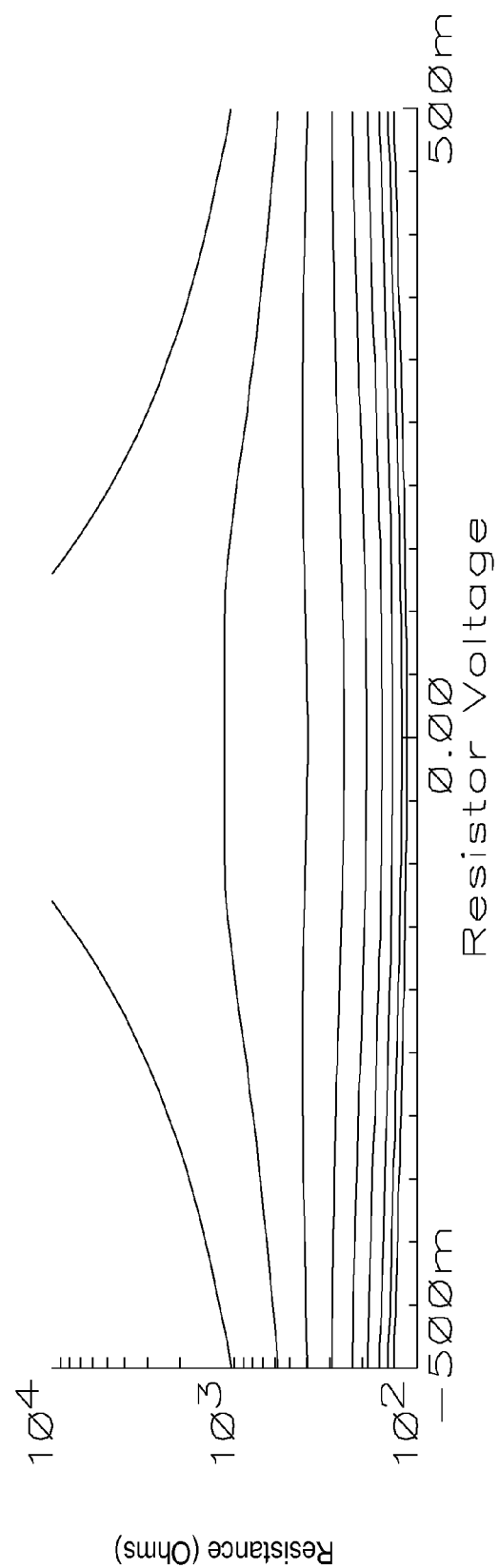
FIG. 3 depicts the results of simulation of an adjustable resistive circuit across an operating voltage range, consistent with an embodiment of the present invention.

FIG. 3 depicts the results of simulation of an adjustable resistive circuit across an operating voltage range, consistent with an embodiment of the present invention. The simulation was done at 100 MHz. The usable resistor range was shown to have a range having a factor of about 3 between maximum and minimum resistive values. The high resistive values were limited by distortion. The low resistive values were limited by the saturation mode of the MOS transistor.

Figure 4:
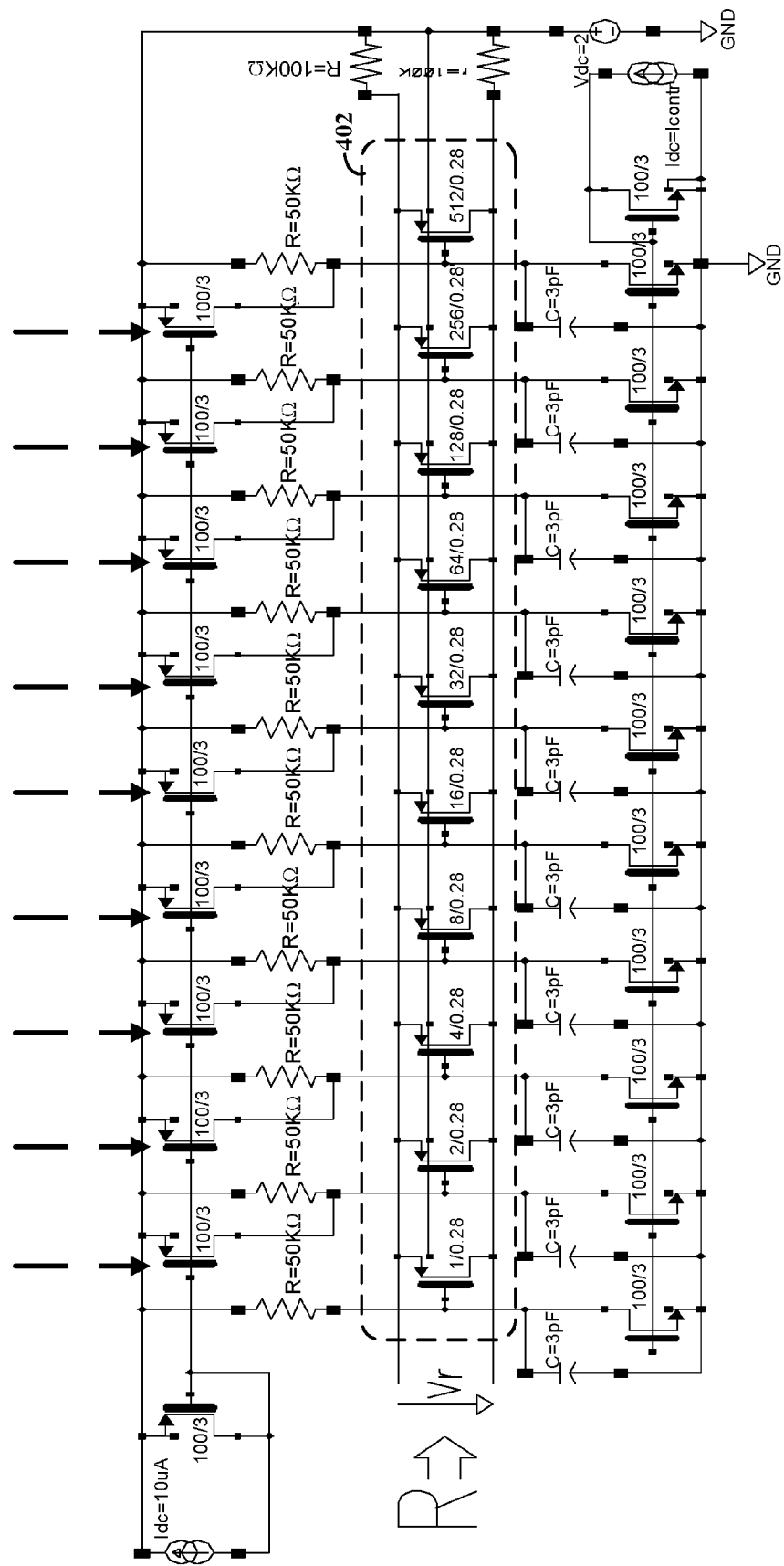
FIG. 4 depicts an adjustable resistive circuit with a plurality of MOS transistor elements, consistent with an embodiment of the present invention.

FIG. 4 depicts an adjustable resistive circuit with a plurality of MOS transistor elements, consistent with an embodiment of the present invention. MOS transistor elements 402 are arranged in parallel relative to input signal Vr to provide resistance R thereto. The MOS transistors are designed with different channel widths such that each MOS transistor is tailored toward a relative resistive range. For instance, MOS transistors with wider channels are used to provide lower-value resistances; however, wide channels can be subject to distortion at higher-value resistances. As such, MOS transistors with narrower channels are used to provide the higher-value resistances. Such an arrangement can be particularly useful for providing a large resistive control range that maintains linearity/consistency for a particular setting.

For instance, the MOS transistors depicted in FIG. 4 are designed with logarithmically increasing (e.g., by a factor of 2) gate widths. For each MOS transistor contributing to the effective resistance of the circuit, the circuit creates a signal delay such that the voltage at each MOS transistor is responsive to $I_{contr}$ to enable the transistors having small channel width first. As the $I_{contr}$ increases, MOS transistors 402 with larger and larger channel widths begin to contribute to the resistive value.

The specific circuit of FIG. 4 depicts 9 PMOS transistors that function as current sources. These transistors are connected to a PMOS transistor providing a fixed current (e.g., 10 µA) to form a current mirror thereof. The 9 transistors are designed with an area factor (e.g., the number of transistors in parallel) that determines the amount of current sourced by the transistor for each stage. For instance, the arrow above each transistor depicts the amount of current sourced by each transistor/stage, with 0 current being provided by the first stage, which has no transistor. The $I_{contr}$ value is mirrored unto each stage and when $I_{contr}$ exceeds the current provided by the current source of a particular stage, a voltage drop begins to appear across the respective resistor. This voltage drop causes a resistive-providing transistor to become conductive. In this manner, the area factor controls how the resistive-providing transistors 402 are sequentially enabled.

In the particular implementations, the upper set of source transistors are designed with the same gate length. The current of each source is determined by the current mirror input current and by the ratio of the effective gate width of output transistor compared with effective gate width of the input transistor. The effective width is the total width of all active gate elements, and is also referred to as the area factor. To control the area factor, the current source transistors can be designed with different effective gate widths and/or the circuit can be implemented by arranging an increasing number of transistors in parallel across each resistor of the stages.

In certain embodiments, the control input (e.g., $I_{contr}$) controls the resistive response of the circuit by activating the MOS transistors 402 (dashed box) with the smallest channels for high-resistive settings and successively activating more MOS transistors 402, with increasingly larger channels, for lower resistive settings. In this manner one transistor after the other becomes conductive following the delayed gate voltages created as a function of the gate area and circuit arrangement.

For example, the depicted circuit is implemented using a mirror input current of 10 μA. The input transistor has a gate width of 100 μm and the output transistors each have a gate width 100 μm. The area factor of the first stage can be 0 (no transistor), and the effective gate width is also 0. The area factor of the second stage can be 1, and the effective gate width is thereby 100 μm. This results in an output current of 10 μA. The area factor of the third stage can be 2 and the effective gate width is 200 μm and the output current is 20 μA. Once $I_{contr}$ exceeds a respective output current the resistor in the stage begins to source the excess current thereby enabling the corresponding resistive-providing transistor.

Other embodiments can be implemented that use transistors in the current mirror that have different gate widths relative to each other. These and other implementations can be used to provide precise control over how the gate voltage of each resistive-providing transistor element is shifted into the desired range. These examples of how to control the successive activation of the resistive-providing transistor elements are not limiting and other circuit implementations are possible.

In the depicted example circuit, when $0\ \mu A < I_{contr} < 10\ \mu A$, the circuit is in a first stage where there is no transistor shunting the current through the resistor. If there is no input current, none of the resistive-providing MOS transistors 402 are enabled. The source transistor of the second stage saturates at 10 μA after which the resistive-providing transistor begins to conduct current from source to drain. The precise numbers (current/resistance) and arrangement of circuit elements can be adjusted according to the desired circuit function.

The sequential activation of the MOS transistors 402 is thereby responsive to the input signal ($I_{contr}$). For example, assuming that the resistive-providing MOS transistors 402 can control a range for $V_{gs}$ of 0V (not conducting) to 500 mV (maximal conductivity) the stages can be described as follows. The first stage of control network starts with $I_{contr}$=0, and with none of the resistive-providing MOS transistors 402 in a conductive state. As $I_{contr}$ increases, $V_{gs}$ also increases. This causes the first transistor to become increasingly conductive up until the limit of the first stage is reached (e.g., $I_{contr}$=10 μA and $V_{gs}$=500 mV). The $V_{gs}$ of the second transistor next increases so that it becomes increasingly conductive until the respective limit is reached (e.g., $V_{gs}$ (second transistor)=500 mV and $I_{contr}$=20 μA). This successive stage enablement occurs for each of the 10 stages. Accordingly, each of the 10 resistive-providing MOS transistors 402 has its own $I_{contr}$ (10 μA) range.

Due to limitations (e.g., non-linearity) on the control range of a single stage, the transistor width ratios can be designed such that successive MOS transistors have overlap of their respective linear ranges. This can be particularly useful for limiting distortion caused by operation of one or more of the MOS transistors outside of the linear operating range. For instance, FIG. 3 shows that for a particular MOS transistor, distortion begins to occur at the high end of the resistive range.

Accordingly, the MOS transistors can be designed such that this high-resistivity distortion region has little effect on the resistance of the entire circuit. By careful selection of the channel widths, the distortion can be effectively hidden by the MOS transistor having the next smallest channel width. For instance, the impedance of the MOS transistor having the next smallest channel width will be much less than that of the transistor in distortion. This is because the distortion shown in FIG. 3 results in a resistance that is too great. The effective resistance of two parallel resistors is governed by the equation 1/(1/R1+1/R2). If R2 is sufficiently high, then this term drops out and the resistance is substantially equal to R1. Accordingly, the distortion of the lower-resistance MOS transistor is overcome by ensuring an overlap of the operating ranges. The MOS transistors can be configured such that this overlap occurs at each transition from one transistor to the other and thereby reduce distortion across the entire range.

Moreover, when a MOS transistor reaches the low end of the resistive control range, the MOS transistor having the next larger channel is already active and will continue to lower the resistance due to both the parallel nature of the transistors and the respective lower resistivity limit due to the wider channel. Accordingly, such implementations can be particularly useful for compensating for distortion generated from all stages.

The contribution of the first stages with smaller transistors is limited by limited maximal Vgs and by gate size related minimal resistance value of each stage. The maximal Vgs is limited by Vds=0 of the output transistors of the Icontr current mirror. The voltage delay of an additional 500 mV from smaller stages to larger stages is the result of an increasing area factor of the P channel current mirror.

Figure 5:
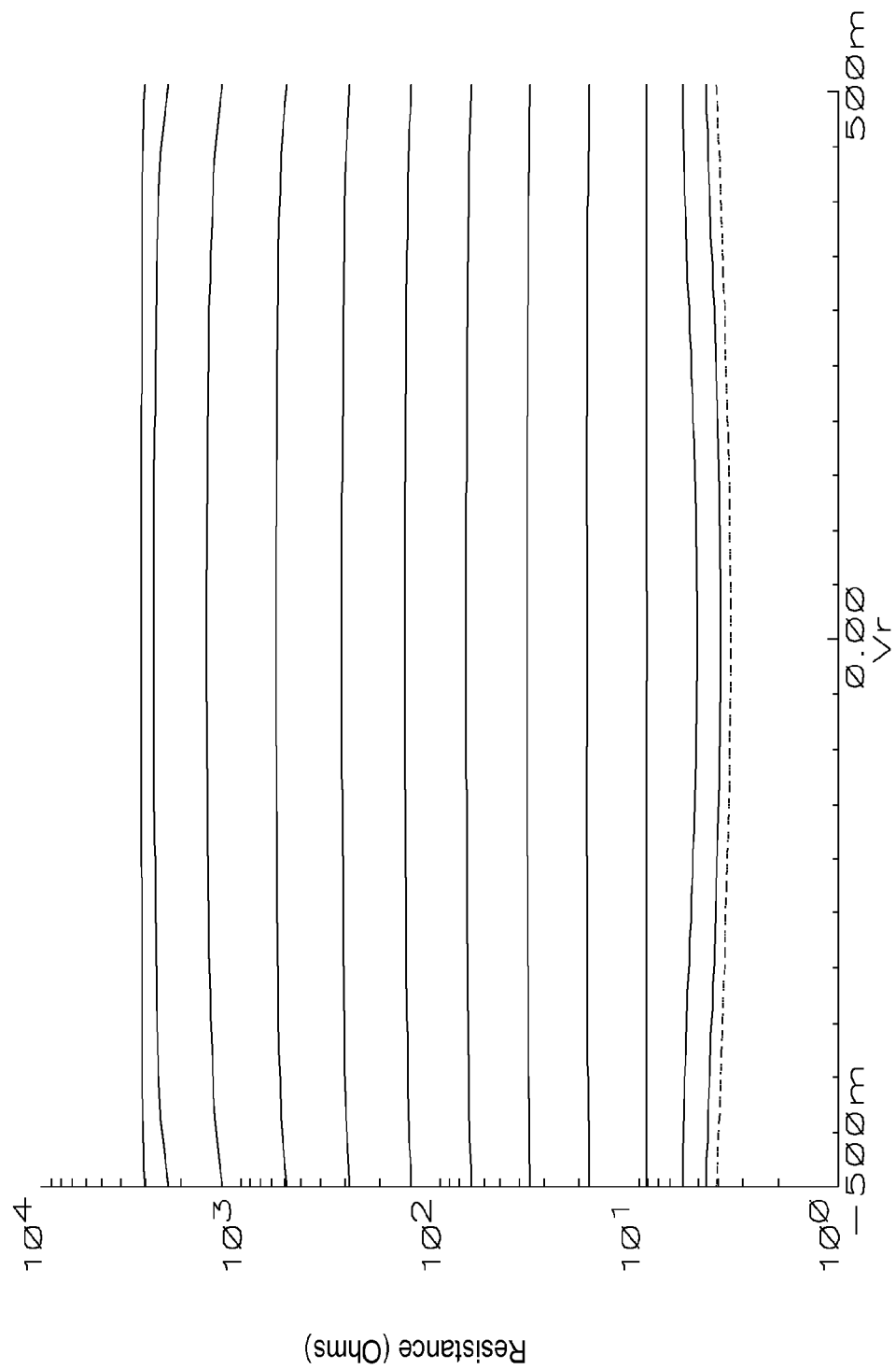
FIG. 5 depicts the results of a simulation of a plurality of MOS transistors configured in parallel, consistent with an embodiment of the present invention.

FIG. 5 depicts the results of a simulation of a plurality of MOS transistors configured in parallel, consistent with an embodiment of the present invention. The simulation was modeled according to circuit diagram and the MOS transistor channel characteristics depicted in FIG. 4. The simulation included ten stages that successively increased in channel width by a factor two. The simulation results were modeled after a 65 nm CMOS process.

The results show that the overlap of the control ranges provides good linearity over a wide operating range. Control current was increased in a stepwise manner.

The results showed a resistor control range of about 5Ω to 3KΩ over which a good linearity was maintained, even for large voltages. The simulation also shows that the third-order intercept point (IP3) was greater than 10V (at 100 mVp/90 MHz+100 mVp/100 MHz). The usable operating voltage drop range was on the order of 500 mVp.

Figure 6:
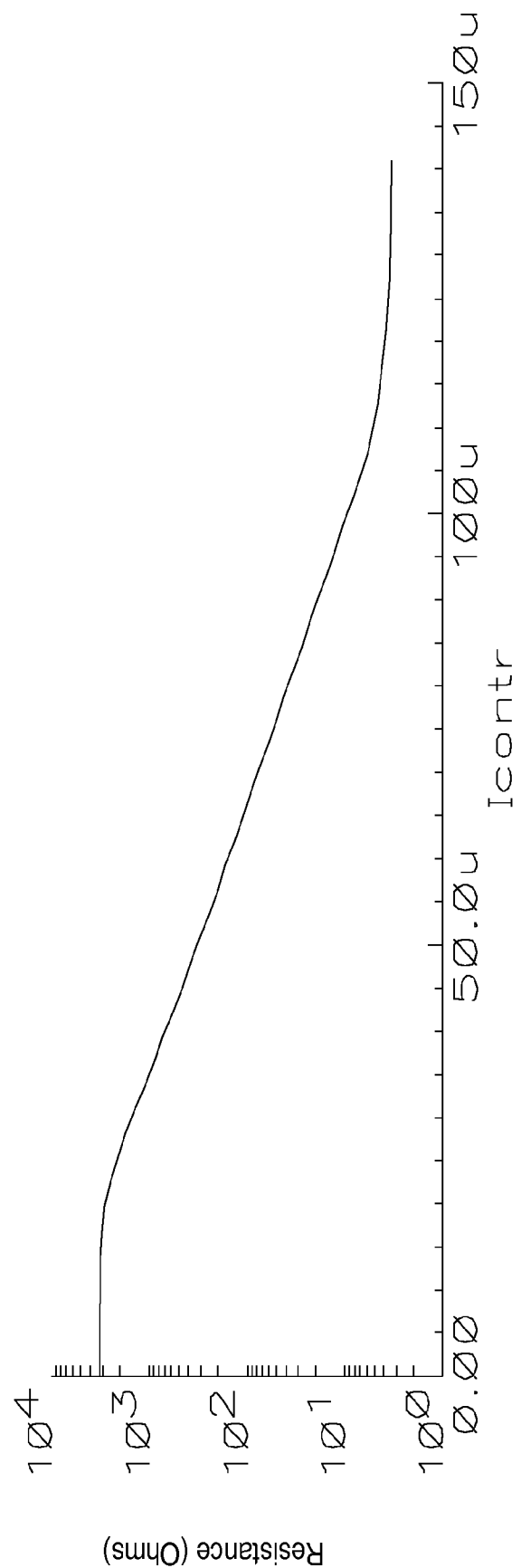
FIG. 6 depicts the logarithmic control characteristic R=f ($I_{control}$) for an adjustable resistive circuit, consistent with an embodiment of the present invention.

FIG. 6 depicts the logarithmic control characteristic R=f ($I_{contr}$) for an adjustable resistive circuit consistent with an embodiment of the present invention. The results were obtained by simulating the setup described in connection with FIG. 5.

Figure 7:
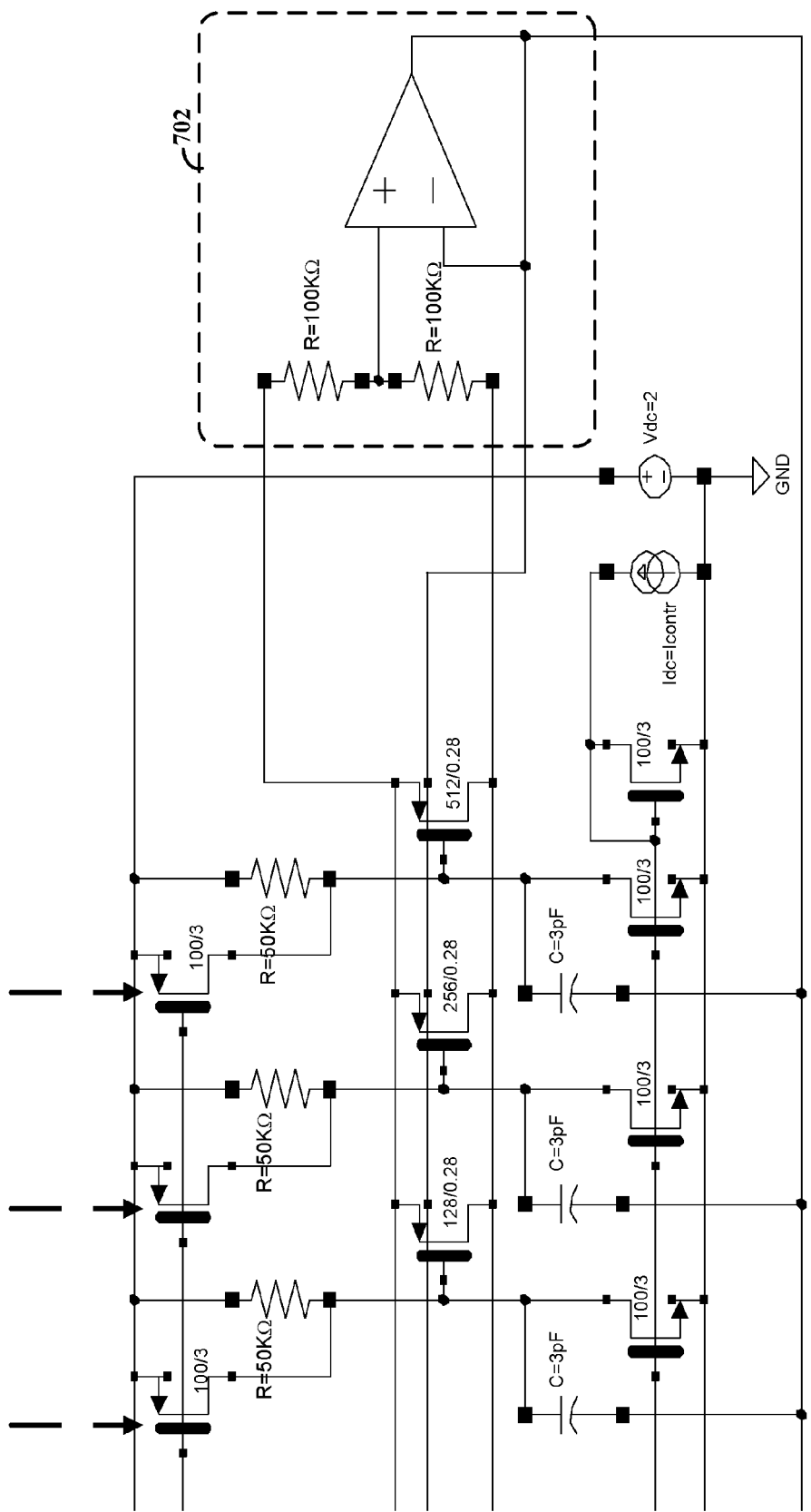
FIG. 7 depicts an adjustable resistor circuit for use with asymmetrical operation, consistent with an embodiment of the present invention.

FIG. 7 depicts an adjustable resistor circuit for use with asymmetrical operation, consistent with an embodiment of the present invention. In certain applications, it is desirable not to level-shift the input signal. Accordingly, the circuit of FIG. 7 provides a dynamic adjustment to the body voltage that compensates for the input signal. This is particularly useful for applications where the input signal would otherwise result in asymmetrical voltages from source to body and drain to body. The feedback circuit 702 (dashed box) controls the voltage applied to the body such that the MOS transistor(s) remain in the linear operating range.

The capacitors connected to the gate of the MOS transistors can be connected to a voltage source that has AC voltage ripple useful for canceling ripple otherwise injected onto the gate. For instance, the capacitors can be connected to one of ground, MOS transistor body or to a voltage supply rail (Vcc).

Such implementations can be particularly useful for filter circuits including, but not limited to, a T or PI configuration.

While the present invention has been described above and in the claims that follow, those skilled in the art will recognize that many changes may be made thereto without departing from the spirit and scope of the present invention.

What is claimed is:

1. An adjustable resistive device comprising:
a first metal-oxide semiconductor (MOS) transistor and a second MOS transistor, each having
a gate,
a drain,
a source,
a body, and
the first and second MOS transistors having different channel widths respectively for different resistance range; and
first circuitry configured to control, in each of the first and second MOS transistors, a resistance between the drain to the source by applying a gate voltage to the gate that is a function of a variable control input; and
second circuitry configured to adjust, in each of the first and second MOS transistors, a voltage at the body according to a ratio of voltage from the drain to the source, whereby the resistance, in each of the first and second MOS transistors, from the drain to the source is relatively linear for at least three voltage values presented at the variable control input.

2. The device of claim 1, wherein, for a particular applied voltage, presented to the gate as the gate voltage, a differential resistance provided by the device is relatively constant.

3. The device of claim 1, wherein the first circuitry includes a voltage divider network that is electrically coupled between a current source and the voltage at the body.

4. The device of claim 3, wherein the device is configured to adjust the value of the linear resistance by varying an amount of current provided by the current source.

5. The device of claim 1, wherein the second circuitry includes a resistor divider network coupled between the source and the drain.

6. The device of claim 1, wherein the voltage values span a voltage range that includes includes zero voltage.

7. The device of claim 1, further including a decoupling circuit configured for filtering noise on the gate.

8. The device of claim 1, wherein a gate voltage is further a function of a drain to source voltage.

9. An adjustable resistive device comprising:
a metal-oxide semiconductor (MOS) transistor having
a gate,
a drain,
a source, and
a body; and
first circuitry configured to control a resistance between the drain to the source by applying a gate voltage to the gate that is a function of a variable control input; and
second circuitry configured to adjust a voltage at the body according to a ratio of voltage from the drain to the source, whereby the resistance from the drain to the source is relatively linear for at least three voltage values presented at the variable control input wherein the linear resistance is effective for voltages within a given voltage range, corresponding to voltages for presentation via a variable control input, and having a frequency component of up to at least 100 Mhz.

10. An adjustable resistive device comprising:
a variable control input;
a plurality of metal-oxide semiconductor (MOS) transistors connected in parallel across a drain and a source of each transistor and each MOS transistor of the plurality having
a gate,
a drain,
a source,
a channel between the source and the drain, and
a body; and
first circuitry configured to adjust a voltage at the gate as a function of the variable control input, and
second circuitry configured to adjust a voltage at the body according to a ratio of voltage from the drain to the source;
wherein each MOS transistor of the plurality of MOS transistors provides a relatively linear resistance from the drain to the source for a different range of at least three voltage values for the variable control input.

11. The device of claim 10, wherein the plurality of MOS transistors are configured with respectively increasing gate widths.

12. The device of claim 10, wherein the plurality of MOS transistors are configured with respectively increasing gate widths, wherein the MOS transistor having the smallest gate width provides the relatively linear resistance for a highest resistive value of the device and wherein the MOS transistor having the largest gate width provides the relatively linear resistance for a lowest resistive value of the device.

13. The device of claim 10, wherein the first circuitry is further configured for adjusting the voltage at the gate as a function of a voltage applied between the drain and source.

14. An adjustable resistive device comprising:
a MOS transistor having a gate, a drain, a source and a body and providing resistive output from drain to source;
a first resistor connected between the source and the body;
a second resistor connected between the drain and the body;
a third resistor connected between the gate and the body;
a controllable current source; and
a current mirror circuit configured for generating a current through the third resistor that mirrors the controllable current source.

15. The device of claim 14, further including a direct current (DC) voltage offset connected between a circuit ground and the body.

16. The device of claim 14, further including a decoupling capacitor connected between the gate and a circuit ground.

17. The device of claim 14, wherein the device further includes a plurality of additional MOS transistors connected in parallel with the MOS transistor, wherein the MOS transistors are configured with successively increasing channel widths.

* * * * *